United States Patent

Chang

[11] Patent Number: 5,841,700
[45] Date of Patent: Nov. 24, 1998

[54] SOURCE-COUPLING, SPLIT GATE, VIRTUAL GROUND FLASH EEPROM ARRAY

[75] Inventor: Ming-Bing Chang, Santa Clara, Calif.

[73] Assignee: National Semiconductor Corporation, Santa Clara, Calif.

[21] Appl. No.: 886,739

[22] Filed: Jul. 1, 1997

Related U.S. Application Data

[62] Division of Ser. No. 941,745, Sep. 8, 1992, Pat. No. 5,412,238.

[51] Int. Cl.$^6$ .................................................. G11C 16/00
[52] U.S. Cl. ................................. 365/185.18; 365/185.16
[58] Field of Search ........................... 365/185.18, 185.1, 365/185.16, 185.01

[56] References Cited

U.S. PATENT DOCUMENTS

| | | | |
|---|---|---|---|
| 4,795,719 | 1/1989 | Eitan | 437/43 |
| 5,017,980 | 5/1991 | Gill et al. | 357/23.5 |
| 5,045,491 | 9/1991 | Gill et al. | 437/52 |
| 5,051,795 | 9/1991 | Gill et al. | 357/23.5 |
| 5,115,288 | 5/1992 | Manley | 365/185.16 |
| 5,274,588 | 12/1993 | Manzur et al. | 365/185 |
| 5,278,439 | 1/1994 | Ma et al. | 257/319 |
| 5,313,421 | 5/1994 | Guterman et al. | 365/185 |
| 5,364,806 | 11/1994 | Ma et al. | 437/43 |
| 5,412,238 | 5/1995 | Chang | 257/321 |
| 5,480,821 | 1/1996 | Chang | 437/43 |
| 5,644,532 | 7/1997 | Chang | 365/185.16 |

OTHER PUBLICATIONS

Kodama, N. et al., "*A 5V Only 16Mbit Flash EEPROM Cell Using Highly Reliable Write/Erase Technologies,*" 1991 Symposium on VLSI Technology, Digest of Technical Papers, IEEE Electron Devices Society, May 28–30, 1991, pp. 75 and 76.

Ajika, N. et al., "*A 5 Volt Only 16M Bit Flash EEPROM Cell with a Simple Stacked Gate Structure,*" International Electron Devices Meeting 1990, San Francisco, CA, Dec. 9–12, 1990, pp. 115–118; pp. 5.7.1–5.7.4.

Yamada, Seiji et al., "*A Self–Convergence Erasing Scheme for a Simple Stacked Gate Flash EEPROM,*" International Electron Devices Meeting 1991, Washington, DC, Dec. 8–11, 1991 pp. 307–310; pp. 11.4.1–11.4.4.

Chang, Ko–Ming et al., "*A Modular Flash EEPROM Technology for 0.8μm High Speed Logic Circuits,*" Proceedings of the IEEE 1991 Custom Integrated Circuits Conference, Town & Country Hotel, San Diego, CA May 12–15, 1991, pp. 18.7.1–18.7.4.

Kuo, Clinton et al., "*A 512–kb Flash EEPROM Embedded in a 32–b Microcontroller,*" IEEE Journal of Solid–State Circuits, Apr. 1992, vol. 27, No. 4, pp. 574–582.

(List continued on next page.)

*Primary Examiner*—Tan T. Nguyen
*Attorney, Agent, or Firm*—Limbach & Limbach L.L.P.

[57] ABSTRACT

A virtual ground flash EEPROM array is based on a source-coupling, split-gate storage cell. The array includes a plurality of spaced-apart, parallel buried n+ bit lines formed in a P-type silicon substrate to define alternating source and drain lines that are segment-contacted. Field oxide islands formed in the array between adjacent source and drain lines define the substrate channel regions of the individual storage cell transistors. The poly 1 floating gate of each cell is formed over a first portion of the substrate channel region and is separated from the channel region by a layer of floating gate oxide. Each floating gate includes a tunnelling arm that extends over the cell's source line and is separated therefrom by thin tunnel oxide. A poly2 word line is formed over the floating gates of the storage cells in each row of the array. The poly2 word line is separated from the underlying floating gate by a layer of oxide/nitride/oxide (ONO). The word lines run perpendicular to the buried n+ bit lines and extend over a second portion of the channel region of each cell in the row to define the internal access transistor of the cell. The word line is separated from the second portion of the channel region by the ONO layer.

1 Claim, 7 Drawing Sheets

OTHER PUBLICATIONS

Woo, B.J. et al., "A Poly–Buffered FACE Technology for High Density Flash Memories," 1991 Symposium on VLSI Technology, Digest of Technical Papers, IEEE Electron Devices Society, May 28–30, 1991, pp. 73–74.

Yoshikawa, Kuniyoshi et al., "An Asymmetrical Lightly Doped Source Cell for Virtual Ground High–Density EPROM's," IEEE Transaction on Electron Devices, vol. 37, No. 4, Apr. 1990, pp. 1047–1051.

Kume, Kitoshi et al., "A 3.42 $\mu m^2$ Flash Memory Cell Technology Conformable to a Sector Erase," pp. 77–78.

Kammerer, W. et al., "A New Virtual Ground Array Architecture for Very High Speed, High Density EPROMS," pp. 83–84.

Riemenschneider, Bert et al., "A Process Technology for a 5–Volt Only 4MB Flash EEPROM with an 8.6 UM2 Cell," 1990 Symposium on VLSI Technology, Digest of Technical Papers, IEEE Electron Devices Society, Honolulu, Jun. 4–7, 1990, pp. 125–126.

Kazerounian, R. et al., "Alternate Metal Virtual Ground EPROM Array Implemented in a 0.8$\mu$m Process for Very High Density Applications," International Electron Devices Meeting 1991, Washington, DC, Dec. 8–11, 1991, pp. 311–314; pp. 11.5.1–11.5.4.

Kynett, V. et al., "A 90–ns One–Million Erase/Program Cycle 1–Mbit Flash Memory," IEEE Journal of Solid–State Circuits, vol. 24, No. 5, Oct. 1989, pp. 1259–1264.

SOURCE-COUPLING, SPLIT GATE, VIRTUAL GROUND FLASH EEPROM ARRAY

This is a divisional of application Ser. No. 07/941,745, filed Sep. 8, 1992, now U.S. Pat. No. 5,412,238.

BACKGROUND OF THE INVENTION

1. Field of the Invention

The present invention relates to memory devices and, in particular, to a virtual ground flash electrically erasable programmable read only memory (EEPROM) array that is based on a source-coupling, split-gate cell.

2. Discussion of the Prior Art

In order to realize flash EEPROM memory arrays having a density of 4 Mbits or higher, technology innovation in both memory cell structure and array architecture is required.

In the past, Intel's well-know "T-shaped" ETOX cell has been intensively utilized in flash memory applications because of its small size and simple stacked gate structure.

FIG. 1 shows a portion of an ETOX cell array in which two ETOX cells, e.g. cells 12a and 12b, share one drain contact 13. FIG. 2 shows a cross-section of an individual ETOX cell taken along line A—A in FIG. 1 (i.e., along polysilicon (poly2) word line 16). FIG. 3 shows a cross-section of an ETOX cell taken along line B—B in FIG. 1 (i.e., along bit line 18).

The ETOX cell 12 is implemented utilizing a very thin gate oxide 20 (about 100 Å thick) and a graded n+/n− source region 22 to enhance reliability by reducing the field across the source junction when the cell 12 is being erased.

As shown in FIG. 4A, the ETOX cell 12 is written in a conventional manner. That is, hot electrons are injected from the drain junction 14 into the polysilicon (poly1) floating gate 24 when the polysilicon (poly2) word line (control gate) 16 is biased at a programming voltage Vpp, the n+ drain bit line 14 is at the positive supply voltage Vcc and the graded source region 22 is held at ground (Vss).

As shown in FIG. 4B, erasing the ETOX cell 12 is performed by Fowler-Nordheim tunnelling of electrons from the floating gate 24 through the thin oxide 20 to the graded source region 22 when the source region 22 is at the programming voltage Vpp, the drain 14 is floating and the word line 16 is at ground (Vss). As stated above, the source 22 is graded to prevent junction breakdown during the erase operation.

Both Kodama et al., "A 5V Only 16 Mbit Flash EEPROM Cell Using Highly Reliable Write/Erase Technologies", Symp. on VLSI Technology, P. 75, 1990", and Ajika et al., "A 5 Volt Only 16M Bit Flash EEPROM Cell with a Simple Stacked Gate Structure", IEDM, p. 115, 1990, have reported 16 Mbit flash EEPROM arrays utilizing the ETOX cell. However, the conventional operational problems associated with the ETOX array, such as write disturb, over-erase and soft write, are minimized in these architectures only by utilizing tight process and bias controls and by utilizing critical operational sequences such as intelligent erase and pre-write before erase.

The term "write disturb" refers to disturbances caused to neighboring cells as a result of the high voltages applied to the gate and drain of a selected cell during a write operation. Write disturb includes "gate disturb", "drain disturb" and "unintentional write".

Gate disturb: for cells along the selected word line, the gate-to-source bias is the gate voltage Vpp, which can cause electrons to tunnel from the source to the floating gate, thus shifting the cell's threshold voltage upward.

Drain disturb: for cells along the unselected word line and the selected bit line, the drain-to-gate bias is the drain voltage, which can cause electrons to tunnel from the floating gate to the drain and shift the cell's threshold voltage downward. Moreover, for a short channel device, lateral punch through by a high drain bias can cause hot hole injection and shift the threshold voltage downward.

Unintentional write: in a virtual ground array, there is always a "mirror" cell along the selected word line that is biased at the same conditions, with source and drain reversed, as the selected cell. If the cells of the array are symmetrical, the mirror cell can be unintentionally written.

The term "over-erase" refers to the condition that occurs when the threshold voltage of an electrically-erased cell becomes negative because the erase voltage is too high and/or the erase pulse width is too long.

The term "soft write" refers to the slow upward shift of a cell's threshold voltage during a read operation due to the presence of channel current. Thus, to read a cell is like writing the cell softly.

The term "intelligent erase" refers to the method by which, in order to keep the threshold voltage of an erased cell within a certain range, the erase process is controlled utilizing an internal or external controller.

The term "pre-write before erase" refers to the method by which, in order to maintain the threshold voltage of an erased cell within a certain range, all cells in the array are written to a high threshold voltage state before erasing.

Recently, Yamada et al., "A Self-convergence Erasing Scheme for a Simple Stacked Gate Flash EEPROM", IEDM, p. 307, 1991, proposed a self-convergence erasing scheme to minimize the over-erase problem associated with ETOX arrays without relying on a complicated intelligent erase scheme. With the Yamada et al. erase scheme, the cell threshold voltage distribution range after erasure can be significantly reduced. However, the reported threshold voltage range is still much wider than that of regular transistors and further verification for Megabit memory arrays remains to be done.

To eliminate the device issues associated with the ETOX cell without relying on either tight process control or critical operational sequences, Chang et al., "A Modular Flash EEPROM Technology for 0.8 $\mu$m High Speed Logic Circuits", IEEE Custom Integrated Circuits Conf., p. 187, 1991, have recently proposed a source-coupling, split-gate (SCSG) flash EEPROM cell.

The FIG. 5 cross-section of the Chang et al. cell 50 shows a floating gate transistor 52 in series with an oxide-nitride-oxide (ONO) split-gate transistor 54. This cell architecture provides a tight erase voltage distribution around 1.3 volts. The source-coupling, split-gate cell 50 is written by channel hot electron injection at the drain junction through a 100 Å tunnel oxide. The cell 50 is erased by tunneling at a finger 56 of the polysilicon floating gate (FG) that extends into the source diffusion, as shown in the FIG. 6 layout. In the Chang et al. cell, the word line (i.e. control gate CG) runs perpendicular to the channel region of the cell 50.

Kuo et al., "A 512-kb Flash EEPROM Embedded in a 32-b Microcontroller", IEEE J. of Solid-State Circuits, Vol. 27, p.574, 1992, have demonstrated the manufacturability of the Chang et al. array in a 512K conventional flash array with a common source bus.

Because, like the ETOX cell, the Chang et al. cell utilizes one-half contact per cell, its size is quite large and further cell scaling is limited. However, the limitations of the ETOX cell and the Chang et al. cell can be minimized by utilizing a virtual ground array architecture, that is, by replacing metal bit lines and contacts with buried diffusion bit lines in a so-called "virtual ground" architecture.

Utilizing a virtual ground architecture and the above-described ETOX cell, Woo et al., "A Poly-Buffered FACE Technology for High Density Flash Memories", Symposium on VLSI Technology, p. 73, 1991, proposed a contactless technology for realizing a very compact flash array. However, due to the symmetrical nature of the ETOX cell and the high bit line capacitance of the Mbit array, unintentional write of a neighboring unselected cell during a write operation is unavoidable.

To minimize the unintentional write problem, Yoshikawa et al., "An Asymmetrical Lightly Doped Source Cell for Virtual Ground High-Density EPROMs", IEEE Trans. on Electron Devices, Vol. 37, p. 1046, 1990, proposed an asymmetrical lightly doped source EPROM cell. However, in addition to the over-erase issue, soft write of a neighboring cell along the selected word line still limits bit line bias and cell current during read operations.

Thus, it would be highly desirable to have available an EEPROM array that eliminates the problems discussed above.

SUMMARY

The present invention provides a virtual ground flash EEPROM array that is based on a source-coupling, split-gate cell. The source-coupling, split-gate, virtual ground (SSVG) array includes a plurality of parallel buried N+ bit lines formed in a P-type silicon substrate to define alternating source and drain lines that are segment-contacted. Field oxide islands formed in the array between adjacent source and drain lines define the substrate channel regions of the individual cell transistors of the array. The poly1 floating gate of each cell is formed over a first portion of the substrate channel region and is separated from the channel region by a layer of floating gate oxide. Each floating gate includes a tunnelling arm that extends over the cell's associated source line and is separated from the source line by thin tunnel oxide. A poly2 word line is formed over the floating gates of the cells in each row of the array. The poly2 word line is separated from an underlying floating gate by a layer of oxide/nitride/oxide (ONO). The word lines of the array run perpendicular to the buried N+ bit lines and extend over a second portion of the channel region of each cell in the row to define the cell's split gate transistor. The word line is separated from the second portion of the channel region by the ONO layer.

Since tunnel oxide exists only along the source lines and the split gate prevents the source/drain from punching through, drain disturb is totally eliminated. Using cell asymmetry and new bias schemes, write disturbs, such as source-to-gate tunneling and unintentional write, are minimized. The array can be sector erased without causing erase disturb. Eliminating bit line contacts results in a very small cell. Existence of the split-gate cell architecture prevents cell over-erase. Since the poly1 floating gate is fully overlapped by the poly2 word line, the cell provides a higher coupling ratio. Because of the cell asymmetry, soft write can be minimized by biasing the source terminal during read. Moreover, source lines can be segmented with select transistors to drastically reduce source line capacitance. Thus, a high performance flash array is realized by increasing the bit line bias without posing a data retention problem.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 7:
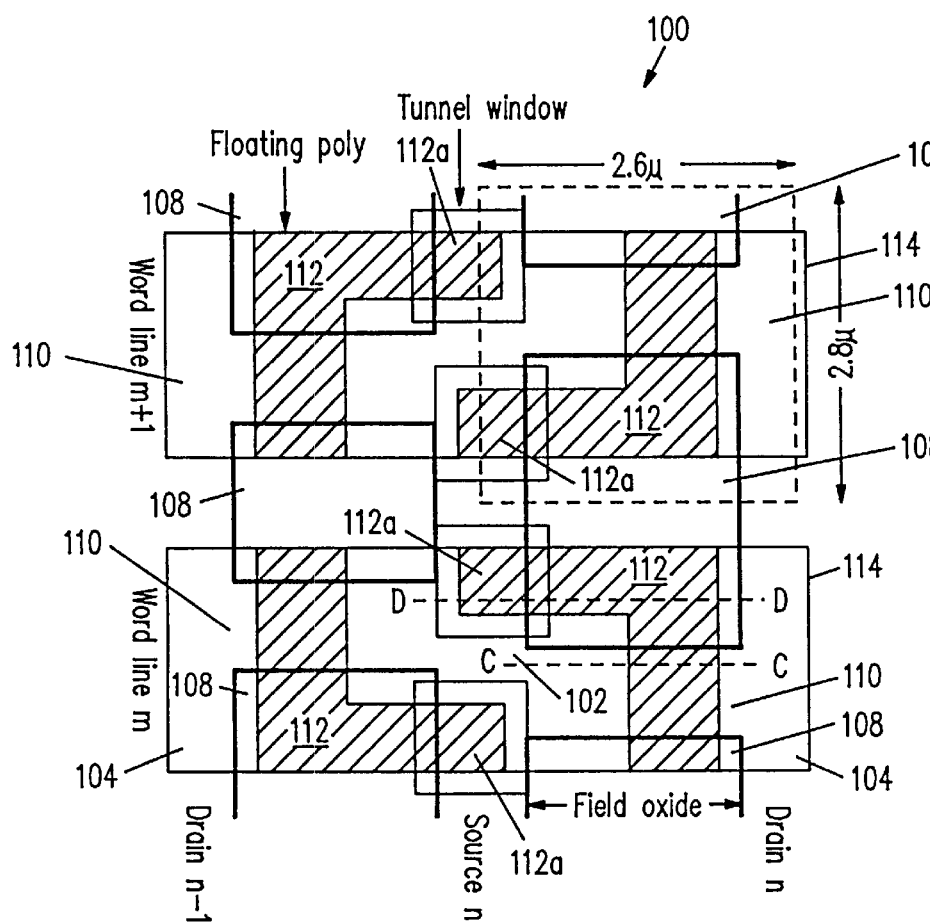
FIG. 7 is a layout illustrating a source-coupling, split-gate virtual ground (SSVG) flash EEPROM array in accordance with the present invention.
Figure 8:
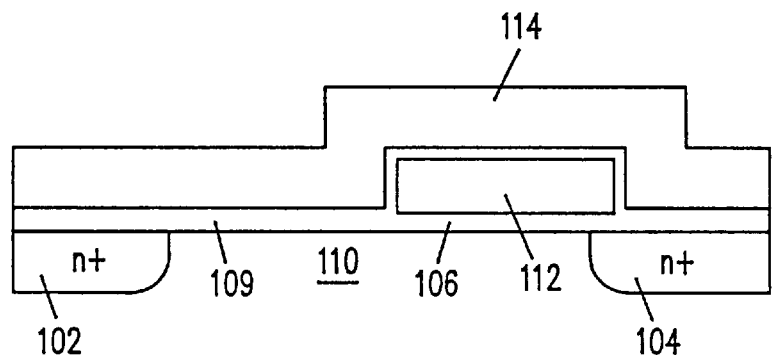
FIG. 8 is a cross-sectional drawing taken along line "C—C" in FIG. 7.
Figure 9:
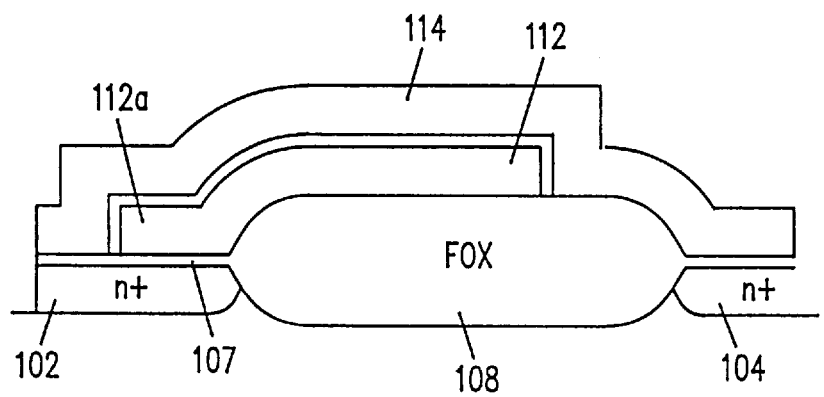
FIG. 9 is a cross-sectional drawing taken along line "D—D" in FIG. 7.

FIG. 7 shows a layout of a portion 100 of a source-coupling split-gate virtual ground (SSVG) flash EEPROM array in accordance with the present invention. FIG. 8 provides a cross-section of a split-gate cell in the array 100 taken along line "C—C" in FIG. 7. FIG. 9 provides a cross-section of the split-gate cell taken along line "D—D" in FIG. 7.

As shown in FIGS. 7–9, in accordance with conventional virtual ground architecture, the array 100 includes parallel, alternating buried n+ source diffusion bit lines 102 and buried n+ drain diffusion bit lines 104. Parallel polysilicon word lines 114 run perpendicular to the n+ bit lines 102, 104. Bit line contacts (not shown) are placed every 16 or 32 word lines, depending on the parasitic bit line resistance.

Field oxide islands 108 are formed in the array 100 between adjacent source and drain buried n+ diffusion lines 102, 104 to define substrate channel regions 110 therebetween, thereby defining the storage cell transistors of the array.

Each storage cell further includes a polysilicon (poly1) floating gate 112 formed over a first portion of the cell's channel region 110 and separated from the substrate by a layer of floating gate oxide 106 about 200 Å thick. Each floating gate 112 includes a tunnelling portion 112a that extends over the associated n+ source line 102 and is separated from the source line 102 by a layer of thin tunnel oxide 107 about 100 Å thick.

As stated above, in each row of cells, a polysilicon (poly2) word line 114 is formed over the floating gate 112 of each cell in the row. The word line 114 is separated from the floating gate 112 by a layer of oxide/nitride/oxide (ONO) 109 about 250 Å thick. The word lines 114 of the array run perpendicular to the buried N+ bit lines 102, 104 and extend over a second portion of the channel region 110 of each cell in the row. The word line 114 is separated from the second portion of the channel region 110 by the ONO layer 109, thereby defining a split gate transistor for each cell.

Figure 1:
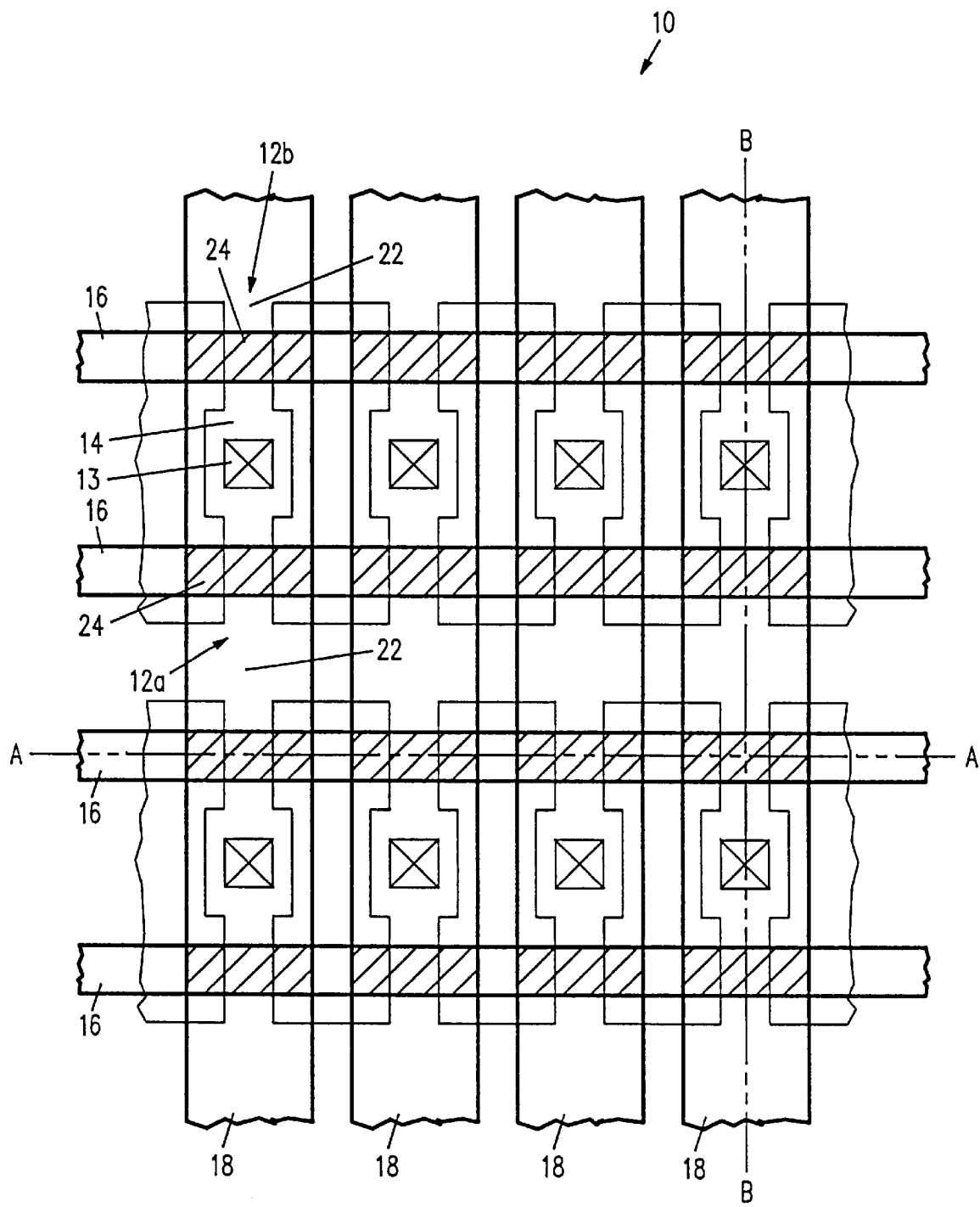
FIG. 1 is a layout illustrating a portion of a conventional ETOX flash array.
Figure 2:
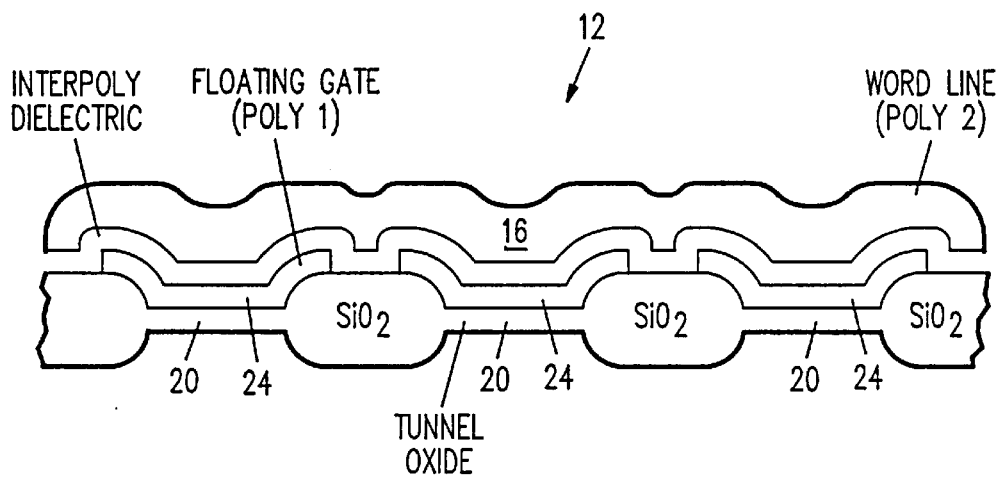
FIG. 2 is a cross-sectional drawing illustrating an individual ETOX cell taken along line A—A of FIG. 1.
Figure 3:
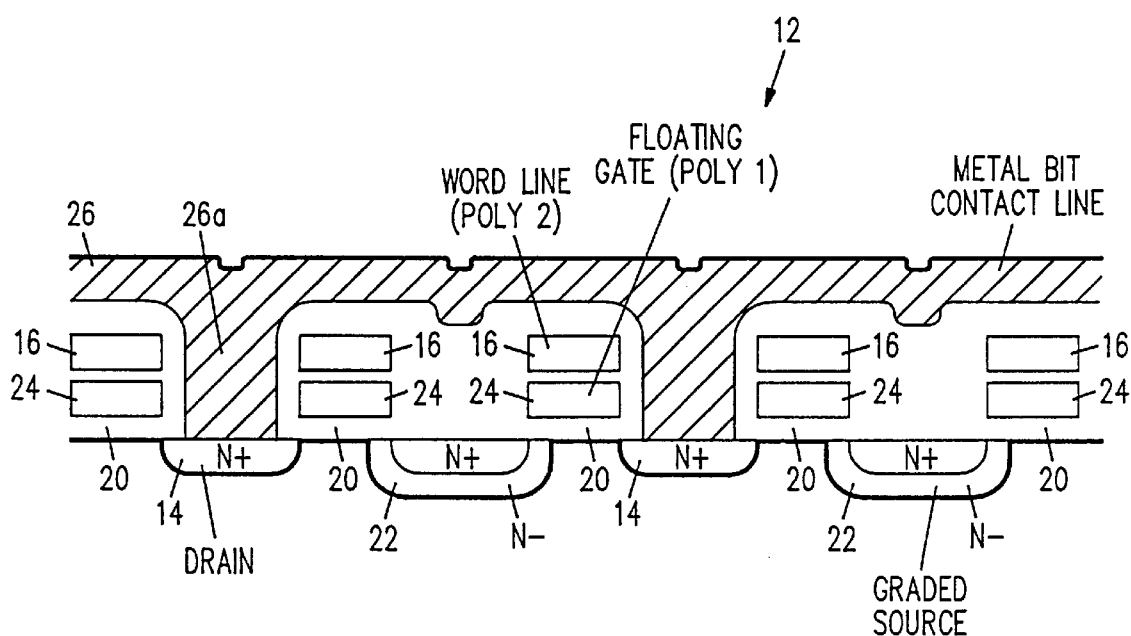
FIG. 3 is a cross-sectional drawing illustrating an individual ETOX cell taken along line B—B of FIG. 1.
Figure 4A:
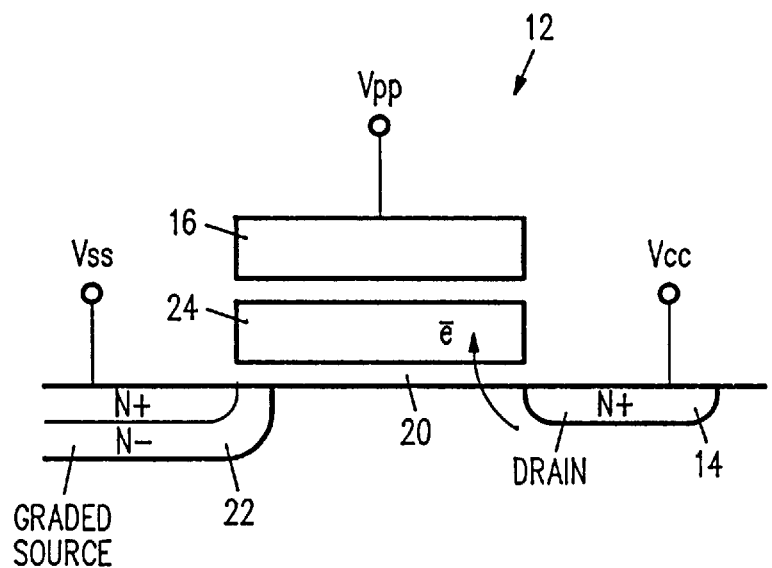
FIG. 4A is a cross-sectional drawing illustrating conventional ETOX cell programming by hot electron injection.
Figure 4B:
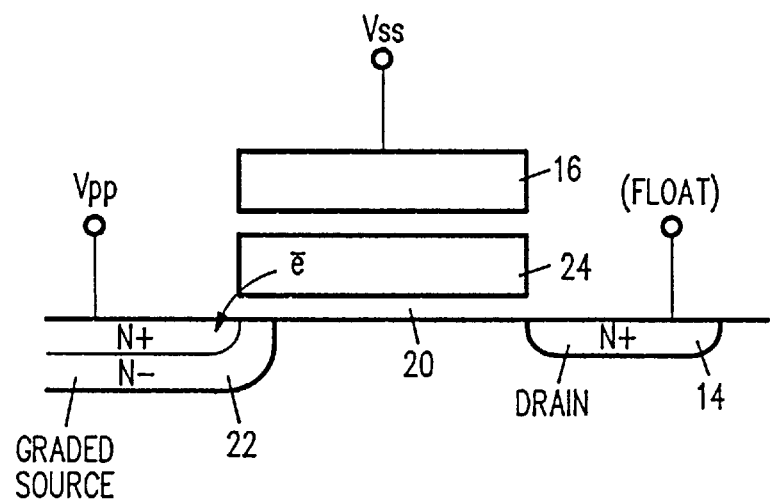
FIG. 4B is a cross-sectional drawing illustrating ETOX cell erasure by Fowler-Nordheim tunnelling.
Figure 5:
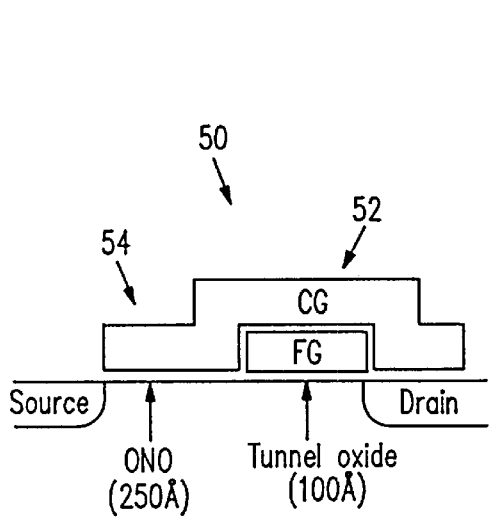
FIG. 5 is a cross-sectional drawing illustrating a conventional source-coupling, split-gate cell.
Figure 6:
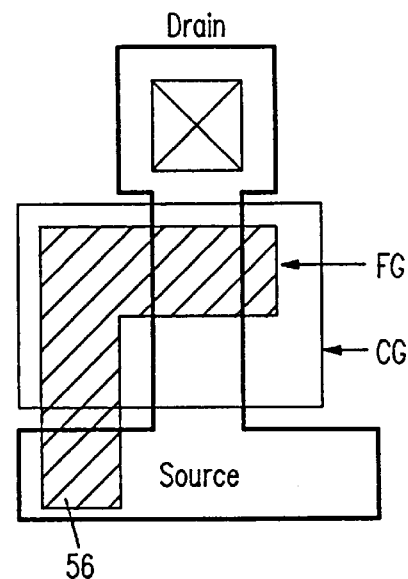
FIG. 6 is a layout illustrating the FIG. 5 cell.

Thus, the FIG. 8 cross-section of the cell, taken along line "C—C" in FIG. 7, is somewhat similar to the Chang et al. cell shown in FIG. 5. However, in the Chang et al cell, the oxide under the floating gate is tunnel oxide about 100 Å thick. In the FIG. 8 cell, there are two oxides under the floating gate 112, namely, floating gate oxide 106 (200 Å) and tunnel oxide 107 (100 Å). Also, in contrast to the Chang et al. array, as shown in FIG. 7, the word lines 114 in the array 100 are parallel with the cell's active channel region 110 thereby making the floating gate transistor channel length alignment-insensitive without relying on word line overlapping.

The size of the FIG. 7 cell (7.28 $\mu m^2$ with 0.8$\mu$ layout rules) is also much smaller than the size of the Chang et al. cell (11.5 $\mu m^2$) and is only slightly larger than the ETOX cell (6.24 $\mu m^2$). Furthermore, the coupling ratio (0.55) of the FIG. 7 cell is higher than that of the Chang et al. cell (0.50) because the floating gate 112 (poly1) is fully overlapped by the word line 114 (poly2).

The operation of the array 100 will now be discussed in conjunction with the array schematic and bias conditions shown in FIG. 10.

Figure 10:
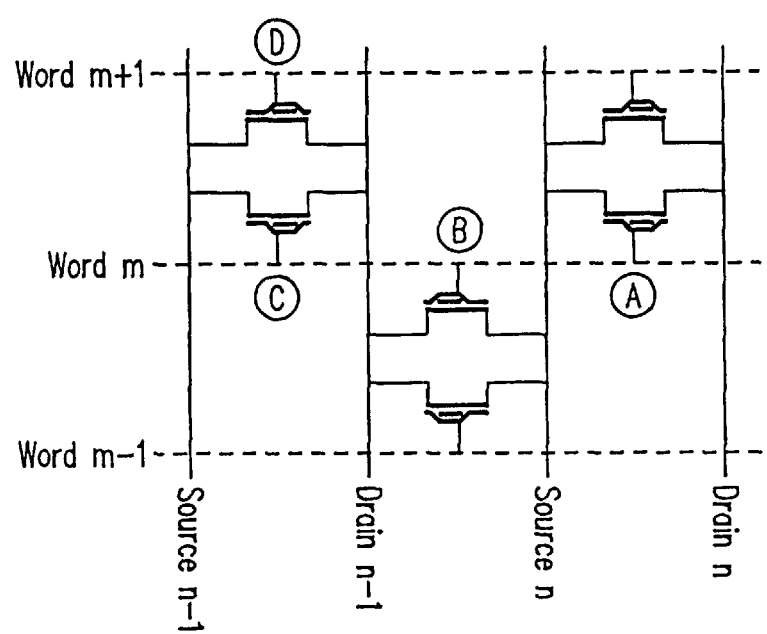
FIG. 10 is a schematic diagram illustrating bias conditions for operation of the FIG. 7 array.

To write cell A in FIG. 10, source line n and drain line n−1 are grounded while the remaining bit lines in the array are biased at 6V. Word line m is biased at 9V and the remaining word lines (m+1 and m−1) are grounded. Under these bias conditions, channel hot electron injection and cell programming occur at the drain junction of cell A.

Since the drain junction of each cell is under 200 Å floating gate oxide and the existence of the ONO transistor helps prevent drain turn-on, drain disturb, which poses a major data retention concern for the ETOX flash array, is eliminated. As far as write disturb is concerned, cell C (the "mirror" cell) is prevented from being unintentionally written because the FIG. 7 cell is asymmetrical and high bit line bias is applied to the source terminal. Device simulation results supporting this fact are presented below.

Although unintentional write cannot occur in a conventional array, gate disturb caused by source-to-gate tunneling poses a data retention concern. With the FIG. 7 array approach described above, only one cell (in this instance, Cell B) experiences the 9V gate disturb during a write operation. For a 1 Mbit array, total gate disturb time is reduced by more than two orders of magnitude from that of the conventional array in which all cells along the selected word line are simultaneously disturbed. Therefore, gate disturb is minimized in the array 100.

Although Chang et al. have demonstrated that gate disturb is not a major concern for a 256K array, this issue becomes more pronounced for the conventional array when the array density is increased and the tunnel oxide thickness is reduced.

On the other hand, a 6V source disturb of cell D is less of a concern than a 9V gate disturb of cell B because of a high source coupling ratio (0.22) and an additional voltage drop in the surface depletion region under the tunnel oxide. Based on this analysis, write disturb is minimized without relying on tight process and bias controls. This is a major advantage over the prior art because cell write disturb is increasingly an issue, especially for a virtual ground array with a symmetrical cell and a thin tunnel oxide.

In addition to the common source line erase scheme described by Chang et al, sector erase can be adopted in the array 100 by applying a negative voltage (−9V) on a selected word line and a positive voltage (5V) on all source lines as well as on all unselected word lines while floating all drain lines. Due to cell asymmetry, erase disturbs such as unintentional write and gate-to-source tunneling, cannot occur. (See Kune et al, "A 3.42 $\mu m^2$ Flash Memory Cell Technology Conformable to a Sector Erase", Symp. on VLSI Technology, p. 77, 1990). Therefore, the array 100 is capable of sector erase while immune to any erase disturb.

With continuing reference to FIG. 10, to read cell B, word line m is biased at 5V while the other word lines (m+1, m−1) are grounded. With respect to bit line biases, drain line n−1 is grounded while the other bit lines (drain line n, source lines n, n−1) are biased at 1.5V with the sense amplifier (not shown) attached to source line n. Using this read scheme, the array 100 is immune to soft write during a read operation because of the cell asymmetry. In the absence of soft write, the bit line bias can be significantly increased with a corresponding increase in the cell current and memory performance. Performance can be further enhanced by adopting a segmented bit line architecture to reduce parasitic bit line capacitance. (See W. Kammerer, B. Sani, P. Kauk, R. Kazerounian, and B. Eitan, "A New Virtual Ground Array Architecture for Very High Density EPROMs", Symp. on VLSI Circuits p. 83, 1991.)

As far as array decoding is concerned, the read operation, as well as the write operation, need to decode two bit lines. From the array layout point of view, decoding two bit lines does not present a layout issue because only two pass transistors of the bit line decoders are laid out within the bit line pitches.

In order to verify that unintentional write of a neighboring cell is not a concern for the array 100 during a write operation, process and device simulations were carried out.

Figure 11A:
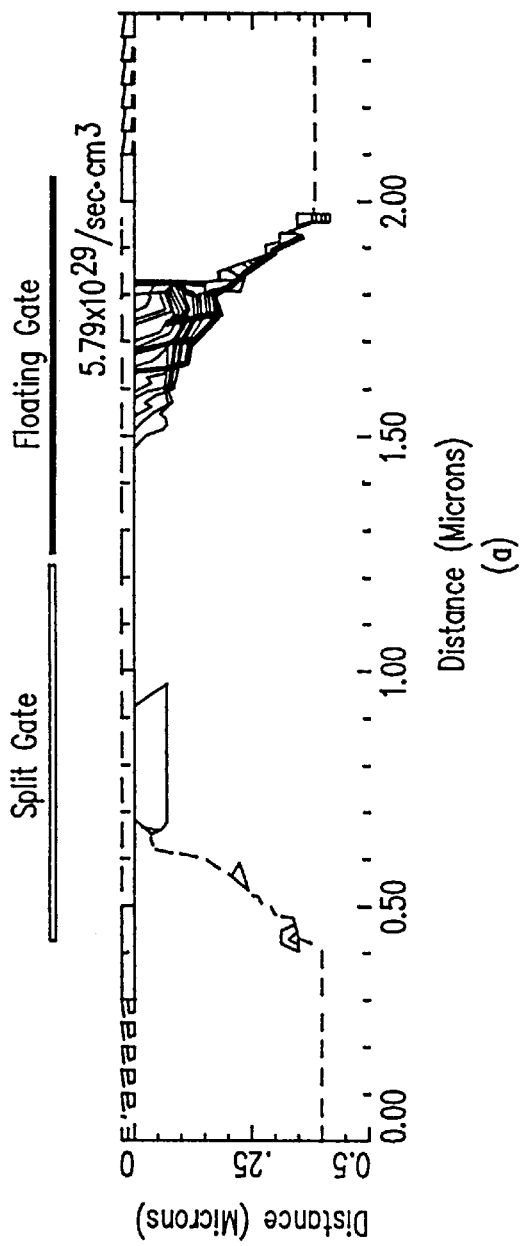
FIGS. 11A and 11B illustrate PISCES simulated hot carrier generation rate contours when a 6V bias is applied to the drain and the source, respectively.
Figure 11B:
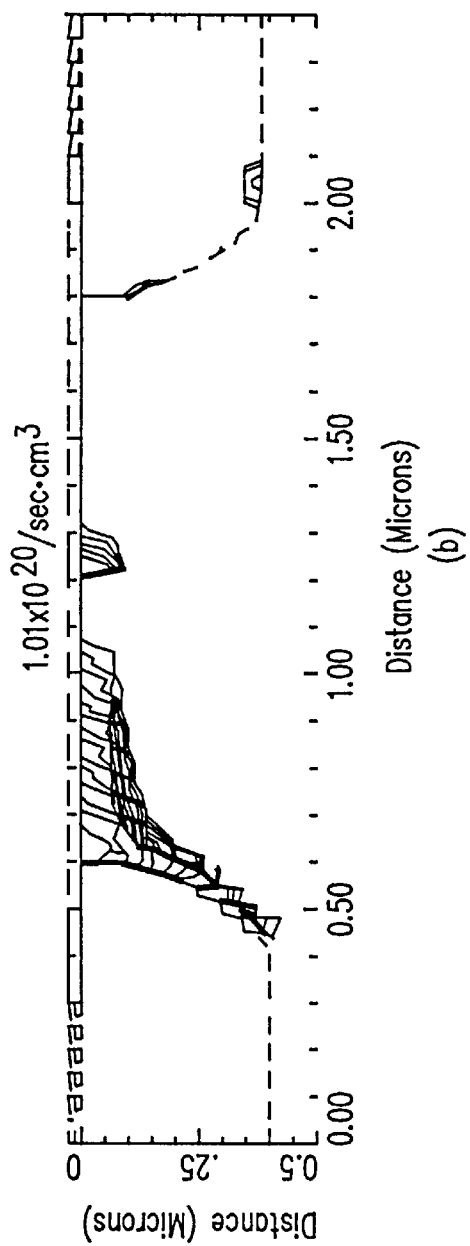

Using the reported process data, a two-dimensional doping distribution was simulated utilizing SUPREM. For a typical cell with a charge-free floating gate threshold voltage of 1V and an erase threshold voltage of −2V, the bias voltage at the floating poly is about 6.5V when the control gate bias is 9V. Using this bias condition, a PISCES simulation, the results of which are shown in FIGS. 11A and 11B, shows hot carrier generation rate contours when a 6V bit line bias is applied to the drain 104 and the source 102, respectively, of the FIG. 7 cell. Due to cell asymmetry, the hot carrier generation rate under the poly1 floating gate 112 is reduced by more than nine orders of magnitude and, thus, unintentional write cannot occur.

The source-coupling, split-gate, virtual ground array 100 described above may be fabricated in a P-type substrate utilizing a conventional process flow.

For example, after processing a silicon wafer in a manor well known in the art to form field oxide islands that define active device regions in the P-type substrate, a layer of floating gate oxide about 200 Å thick is formed on the substrate. The floating gate oxide is then masked to define tunnel oxide windows and a tunnel implant (As$^+$ 3×10$^{14}$) is performed to form n+ regions under the tunnel oxide for purposes of cell erasure. The tunnel windows are then etched through to the substrate and tunnel oxide about 100 Å thick is grown in the tunnel windows.

Next, a first layer of polysilicon (poly1) is formed and it's conductivity is adjusted by the addition of an appropriate dopant. A layer of nitride about 150 Å thick is then deposited on the poly1 layer. The nitride and poly1 layers are then masked and etched to define the irregular poly1 lines that will ultimately be further defined in a stacked etch step to provide the floating gates of the array cells. Definition of the poly1 lines is followed by a self-aligned n+ diffusion and buried n+ implant to define the parallel N+ buried drain and source bit lines, respectively, in the substrate.

Following the buried n+ bit line implant, bit line oxide about 500 Å thick is grown and the floating gate nitride is stripped from the poly1. A split gate mask is then formed to enable the removal of oxide from the top of the split gate. After the split-gate oxide etch, a composite layer of oxide/nitride/oxide (ONO) about 250 Å thick is formed over the array. The ONO is then etched to remove ONO in the peripheral area before gate oxide is grown.

Following conventional process steps to define features in the periphery of the array, a second layer of polysilicon (poly2) is deposited and doped to the appropriate conductivity. Next, a layer of TEOS oxide about 1000 Å thick is deposited over the poly2. A poly2 mask is then formed and the TEOS oxide and poly2 are etched to define the wordlines of the array.

Next, a stacked gate mask is defined and the TEOS layer is utilized as a hard mask in a stacked etch step to complete the definition of the ONO and the poly1 floating gates.

Processing continues in the conventional manner following the poly stack etch to define the remainder of the array.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method of reading a selected EEPROM cell in a source-coupling, split-gate, virtual ground (SSVG) flash EEPROM array that is formed in a silicon substrate of P-type conductivity and includes a plurality of spaced-apart, parallel buried n+ bit lines formed in the silicon substrate to define alternating source and drain lines, a plurality of spaced-apart field oxide islands formed between adjacent source and drain lines to define substrate channel regions therebetween, and, for each channel region, a poly1 floating gate formed over a first portion of said channel region and separated therefrom by a layer of floating gate oxide, said floating gate including a tunnelling portion that extends over the source line associated with said channel region and is separated therefrom by tunnel oxide, and, for each floating gate, a poly2 word line formed over said floating gate and separated therefrom by a layer of oxide/nitride/oxide (ONO), said word line running perpendicular to the buried N+ bit lines and extending over a second portion of said channel region and separated from said second portion of said channel region by said layer of ONO, the read method comprising:

biasing the word line associated with the floating gate of the selected EEPROM cell at a read voltage while maintaining the remaining word lines in the array at ground; and maintaining the drain bit line of the selected EEPROM cell at ground while biasing the remaining bit lines of the array at a read bias voltage with the sense amplifier attached to the source line of the selected cell.

* * * * *